United States Patent [19]

Lienard

[11] Patent Number: 4,739,308

[45] Date of Patent: Apr. 19, 1988

[54] METHOD FOR THE FORMATTING AND UNFORMATTING OF DATA RESULTING FROM THE ENCODING OF DIGITAL INFORMATION USING A VARIABLE LENGTH CODE AND A DEVICE FOR USING THIS METHOD

[75] Inventor: Jean Lienard, Clamart, France

[73] Assignee: Thomson-CGR, Paris, France

[21] Appl. No.: 2,218

[22] Filed: Jan. 12, 1987

[30] Foreign Application Priority Data

Jan. 13, 1986 [FR] France ................. 86 00369

[51] Int. Cl.$^4$ ............................ H03M 7/40
[52] U.S. Cl. ............................ 340/347 DD
[58] Field of Search ................. 340/347 DD

[56] References Cited

U.S. PATENT DOCUMENTS

| 3,835,467 | 9/1974 | Woodrum | 340/347 DD |
| 3,918,047 | 11/1975 | Denes . | |
| 4,044,347 | 8/1977 | Van Voorhis | 340/347 DD |
| 4,593,267 | 6/1986 | Kuroda et al. | 340/347 DD |

FOREIGN PATENT DOCUMENTS

| 0040025 | 11/1981 | European Pat. Off. . |
| 0098153 | 1/1984 | European Pat. Off. . |
| 0142439 | 5/1985 | European Pat. Off. . |
| 2552694 | 6/1977 | Fed. Rep. of Germany . |
| 2948770 | 8/1980 | Fed. Rep. of Germany . |
| 2012462 | 1/1978 | United Kingdom . |

OTHER PUBLICATIONS

IBM Technical Disclosure Bulletin, vol. 19, No. 5, Oct. 1976, pp. 1892-1895, New York, US; Y. Dishon et al.: "Variable-Length Data Assembler".
IBM Technical Disclosure Bulletin, vol. 20, No. 12, May 1978, pp. 5332, 5333, New York, US; J. W. Peake: "Parallel Decoding of Variable Length Codewords".
IBM Technical Disclosure Bulletin, vol. 26, No. 9, Feb. 1984, pp. 4794-4797, New York, US; J. W. Peake: "Decompaction".

Primary Examiner—William M. Shoop, Jr.
Assistant Examiner—Richard K. Blum
Attorney, Agent, or Firm—Oblon, Fisher, Spivak, McClelland & Maier

[57] ABSTRACT

The formatting/unformatting device of the invention especially comprises a formatting device made up of a justifier linked to an input register, the output of which is linked, through a multiplexer, to the residue input of the justifier as well as to a first intermediate register through another multiplexer and to another multiplexer. The latter multiplexer is linked to a second intermediate register and an output multiplexer, the output of which is linked to an output register which acts as a buffer for the bulk memory.

5 Claims, 6 Drawing Sheets

METHOD FOR THE FORMATTING AND UNFORMATTING OF DATA RESULTING FROM THE ENCODING OF DIGITAL INFORMATION USING A VARIABLE LENGTH CODE AND A DEVICE FOR USING THIS METHOD

BACKGROUND OF THE INVENTION (1) Field of the Invention

The present invention pertains to a method for the formatting and unformatting of data resulting from the encoding of digital information by means of a variable length code and a device to use this method.

(2) Description of the Prior Art

For the swift recording with maximum compactness of a very large number of digital data such as the successive values of the pixels of a digitalized picture, these data are generally compacted by using a variable length code, the successive encoded values being concatenated and sent to a bulk memory such as a unit with flexible disks. When the picture-acquisition speed is high (15 pictures per second or more) as is in the case with optical image formation in medicine, the formatting devices of the prior art which perform the concatenation are not fast enough. This makes it necessary either to reduce the rate of picture acquisition causing a loss of data or to use several formatting and storage devices alternately, thus considerably increasing the cost price of the system.

The object of the present invention is a method for formatting and unformatting data resulting from the encoding of digital information by means of a variable length code, a method which provides for the high-speed acquisition of this digital data. The object of the present invention is also a simple and uncumbersome device to use this method.

SUMMARY OF THE INVENTION

The method of the invention pertains, at the formatting level, to the concatenation of encoded words of variable length, to the cutting up of the string thus obtained into entities of the same length and to the sending of these entities consecutively to a bulk memory device, the length of these entities being equal to the number of bits which can be simultaneously sent to this memory device, and, at the unformatting level, to the performance of the reverse operations in order to restore the said encoded words. According to the invention, this method consists, at the formatting level, in the temporary and consecutive storage of the encoded words in an input register and in their justification, after a residue if any, towards one of the ends of this register; it then consists in their division, starting from the said end, into adjacent slices of the same length, where the slice comprising the other end may be incomplete and may constitute the said residue, these slices comprising four bits; it then consists in their transfer from the register at the starting level to a register at the output level (the capacity of this register being equal to the length of the said entities). According to the method of the invention, the encoded words, in their transfer from the register at the starting level to the register at the output level, pass, if necessary, through all the complete slices of the starting level by means of intermediate-level registers, shifting if necessary, the remaining incomplete slice to the said end of the starting-level register, the intermediate registers each having a capacity equal to a whole multiple of the length of a slice. This capacity increases from the starting level to the output level, the complete slices being transferred after those of the intermediate levels, in order and by priority, towards the output level until it is completely filled. Slices which, as may happen, cannot be transferred to this output level because it is completely full are transferred to the intermediate-level registers so that they fill either, by priority, those registers which already contain slices which could not earlier be transferred to the output level, then those registers whose capacity is closest to the capacity needed to take the remaining slices, using the minimum number of levels or, if all the intermediate levels are empty, they fill one or more of those intermediate levels, using them to the minimum extent, the content of these intermediate levels being then transferred, by priority, to the output level in keeping with the order of precedence in time, the content of the output level being transferred towards the bulk memory device as soon as it is full. At the unformatting level, the method of the invention consists in the temporary and consecutive storage of the successive slices of the concatenated codes from the bulk memory in a higher-level register with a capacity equal to the longest code used, in the pre-justification at one end of this register of the code closest to this end of the register so that the end of the code which is closest to this end of the register reaches the end of an end zone of determinate length in the register by a shift equal to a whole number multiplied by the length of the zone. Furthermore, the method of the invention at the unformatting level consists in the transfer (at least partially) of the code thus pre-justified to one or more intermediate registers, justifying this code at one end of these registers, and in the transfer of the code thus justified to an output register. According to one aspect of the method according to the invention, first the prefix of the code and then its suffix is justified.

The formatting device of the invention comprises a justifier linked to the input of an input register, the output of which is linked, firstly, to an input of the justifier through a first multiplexer and, secondly, to a first intermediate register through a second multiplexer and to a third multiplexer, the output of the first intermediate register being also linked to this third multiplexer, the output of the third mutiplexer being linked to a second intermediate register and a fourth multiplexer to which is also linked the output of the second register, the output of the fourth multiplexer being linked to an output register.

The unformatting device of the invention comprises a pre-justifier followed by a justifier, the pre-justifier comprising at least one input register followed by a multiplexer and a pre-justifying register, the justifier comprising at least one stage of shifter logic circuits and one multiplexer. According to an advantageous feature of the invention, the justifier comprises a prefix justifier followed by a suffix justifier each comprising a stage of shifter logic circuits and one multiplexer.

BRIEF DESCRIPTION OF THE DRAWINGS

The present invention will be better understood from the following detailed description of a mode of embodiment taken as a non-exhaustive example and illustrated by the appended drawings of which.

Figure 1:
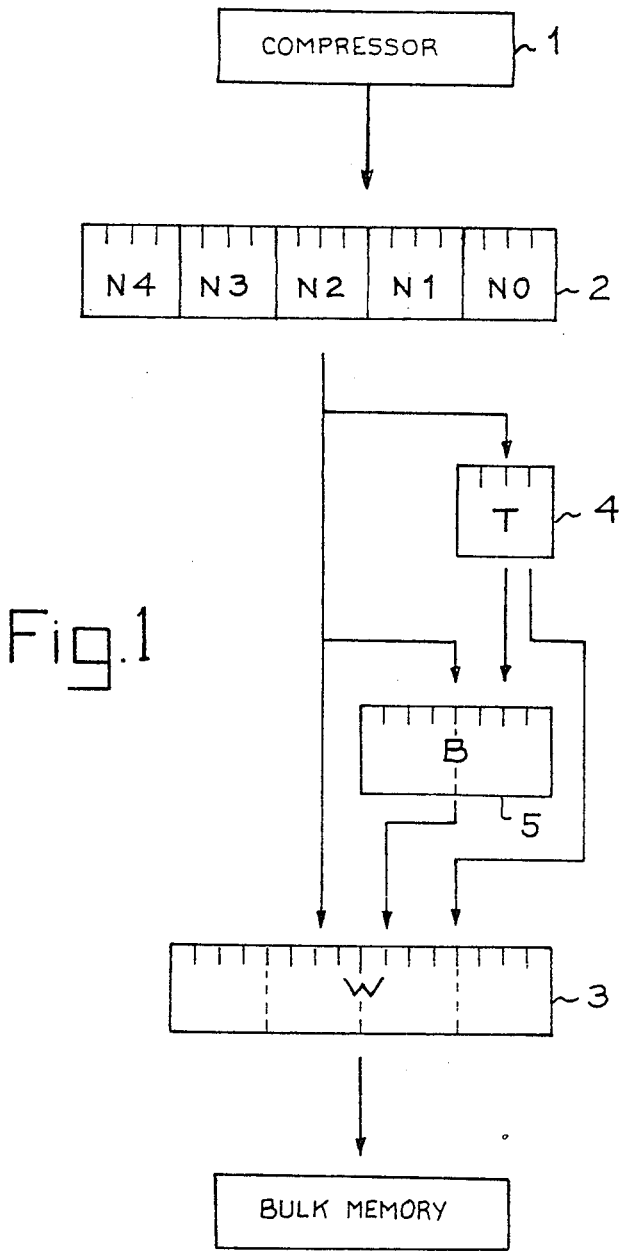
FIG. 1 is a diagram explaining the operation of a formatting device according to the invention.

The formatting/unformatting device described above is used in a machine for the real-time recording on magnetic disks of digitalized pictures such as pictures in angiography, after compression by variable-length code, the pictures thus recorded being subsequently restored according to a reverse processing method, but it is clearly understood that the invention is not limited to an application of this kind and that it can be used to format various sorts of data which are digitalized and compressed according to a variable-length code and, after recording and/or transmission to unformat, decompress and restore the original data.

The digital data from the digitalization of the pictures are compressed in a compressor 1 which uses a variable length code such as a Huffman code. The role of the formatting device is to concatenate these codes and then cut up the string of bits thus obtained into slices of constant length, the length of these slices being such that they can be directly taken into account and recorded on the magnetic disk by the recording circuits of this disk. This length is generally equal to sixteen bits for standard disks. Of course the processing of the pictures and their recording must be done at a speed which is at least equal to the speed of acquistion of these pictures.

The codes, of a variable length m, which come in succession from the compressor 1, are sent to an input register 2 and are justified in it, for example, at the right-hand end (on the diagram) of this register. The register 2 is divided into two equal and adjacent slices. In a preferred mode of embodiment, for which the maximum length of the codes at the output of the compressor is sixteen bits and the length of the words sent to the disk is sixteen bits, the register 2 has a capacity of twenty bits and is divided into five slices of four bits each, bearing the references N0 to N4 respectively.

The formatting device comprises an output register 3, the capacity of which, in the present example, is sixteen bits because this register loads a bulk memory which, here, is a flexible disk unit, the input of which has sixteen bits. The formatting device further comprises a first intermediate register 4, the capacity of which is equal to that of a slice of the register 2, and a second intermediate register 5, the capacity of which is equal to that of two slices of the registers 2. In the present case, the capacities of the registers 4 and 5 are four and eight bits respectively. Depending on its content, the register 2 can load one or more of the registers 3 to 5, the register 4 can load the register 3 or the register 5 and the register 5 can load the register 3. We shall explain below how these different loading operations are performed, always in whole multiples of the length of a slice of the register 2.

When a first codeword is sent by the compressor 1 to the register 2, this word is right justified in this register and, more precisely, at the right-hand end of the slice N0 of the register 2. Depending on the length of this word, there can be various possibilities of loading the other registers of the formatting device:

If the length of this word is equal to or less than three bits, it is loaded into the three right-hand cells of N0 and stays there. The second word coming from the compressor is immediately loaded to the left of this residue and the data obtained from these two words will be processed as explained below with reference to a first word the length of which is equal to at least four bits, If the length of this word ranges from four to seven bits, the four bits of the right-hand side are transferred to the register 4 and the residue if any, is then transferred into N0 and is right justified.

If the length of this word ranges from eight to eleven bits, the first eight bits starting from the right-hand side are transferred into the register 5 and the residue, if any, is then transferred into N0 and right justified;

And finally, if the length of this word is sixteen bits, these bits are directly transferred into the register 3 and the content of the register 3 is transferred to the bulk memory.

When the compressor 1 sends the register the second codeword and then the following codewords which, as specified above, are loaded immediately to the left of the residue if any, or are right justified in this register 2 if there is no residue, the transfers process described above remains valid and the occupation of the registers 4 and 5 if any, causes the transfers among the registers explained in table No. 1 below.

In this table, the variable q is equal to the whole part of the ratio 1/n wherein n is the length of the data contained in the register 2 (with $l=m+r$, m being the length of the codeword sent by the compressor 1 and r the length of the residue if any) and n is the length of a slice of the register 2 and, in the present case, $n=4$ and r can therefore range from 0 to 3. The contents of the registers 3, 4 and 5, when these registers are full, are respectively marked W, T and B. The variables f(W), f(T) and f(V) are "flags" which, if they equal 1, indicate that the registers 3, 4 and 5 respectively are occupied and, if they equal 0, that these registers are vacant. In the second and third columns, the values of the flags are pre-transfer values and, in the right-hand column they are post-transfer values. In the "transfers" column a transfer from the level (slice or register) (Y) to the level (Z) is symbolized by $(Z)=(Y)$. When there is a transfer from several levels, they are noted from left to right in increasing order of timewise precedence of their respective contents (the "timewise precedence" in the register 2 is in increasing order from N4 to N0 since successive codewords are loaded in the register 2 to the left of the residue if any, of the preceding word, this residue being the left-hand side of the said preceding word). In the following table, the residues if any, are not mentioned because they are not transferred.

Thus the content of the bulk memory can be compared to a continuous string of codewords arranged in chronological order (the loading and reading of the memory being sequential). The concatenation of successive codewords is used to make the transfers to the bulk memory with the maximum efficiency since these transfers are done in parallel and since the sequential operations (transfers from 1 to 2, then 2 to 3, if necessary through the intermediate registers, and from 3 to the bulk memory) can be paced by a common clock (i.e. pipelining).

TABLE No. 1

| q | f(T) | f(B) | Transfers | Flags |
|---|------|------|-----------|-------|
| 0 | x | x | None | |
| 1 | 0 | x | (T) = (N0) | f(T) = 1 |
| | 1 | 0 | (B) = (N0)(T) | f(B) = 1, f(T) = 0 |
| | 1 | 1 | (W) = (N0)(T)(B) | f(W) = 1, f(B) = 0, f(T) = 0 |
| 2 | 0 | 0 | (B) = (N1)(N0) | f(B) = 1 |
| | 0 | 1 | (W) = (N1)(N0) | f(W) = 1, f(B) = 0 |
| | 1 | 0 | (B) = (N0)(T) | f(B) = 1, f(T) = 0 |
| | 1 | 1 | (W) = (N0)(T)(B), (T) = (N1) | f(W) = 1, f(B) = 0, f(T) = 1 |
| 3 | 0 | 0 | (B) = (N1)(N2), (T) = (N2) | f(B) = 1, f(T) = 1 |
| | 0 | 1 | (W) = (N1)(N0)(B), (T) = (N2) | f(W) = 1, f(T) = 1, f(B) = 0 |
| | 1 | 0 | (W) = (N2)(N1)(N0)(T) | f(W) = 1, f(T) = 0 |
| | 1 | 1 | (W) = (N0)(T1)(B), (B) = (N2)(N) | f(W) = 1, f(B) = 1, f(T) = 0 |
| 4 | 0 | 0 | (W) = (N3)(N2)(N1)(N0) | f(W) = 1 |
| | 0 | 1 | (W)(N1)(N0)(B), (B)(N3)(N2) | f(W) = 1, f(B) = 1 |
| | 1 | 0 | (W) = (N2)(N1)(N0)(T), (T) = (N3) | f(W) = 1, f(T) = 1 |
| | 1 | 1 | (W) = (N0)(T)(B), (B) = (N2)(N1), (T) = (N3) | f(W) = 1, f(B) = 1, f(T) = 1 |

Figure 2:
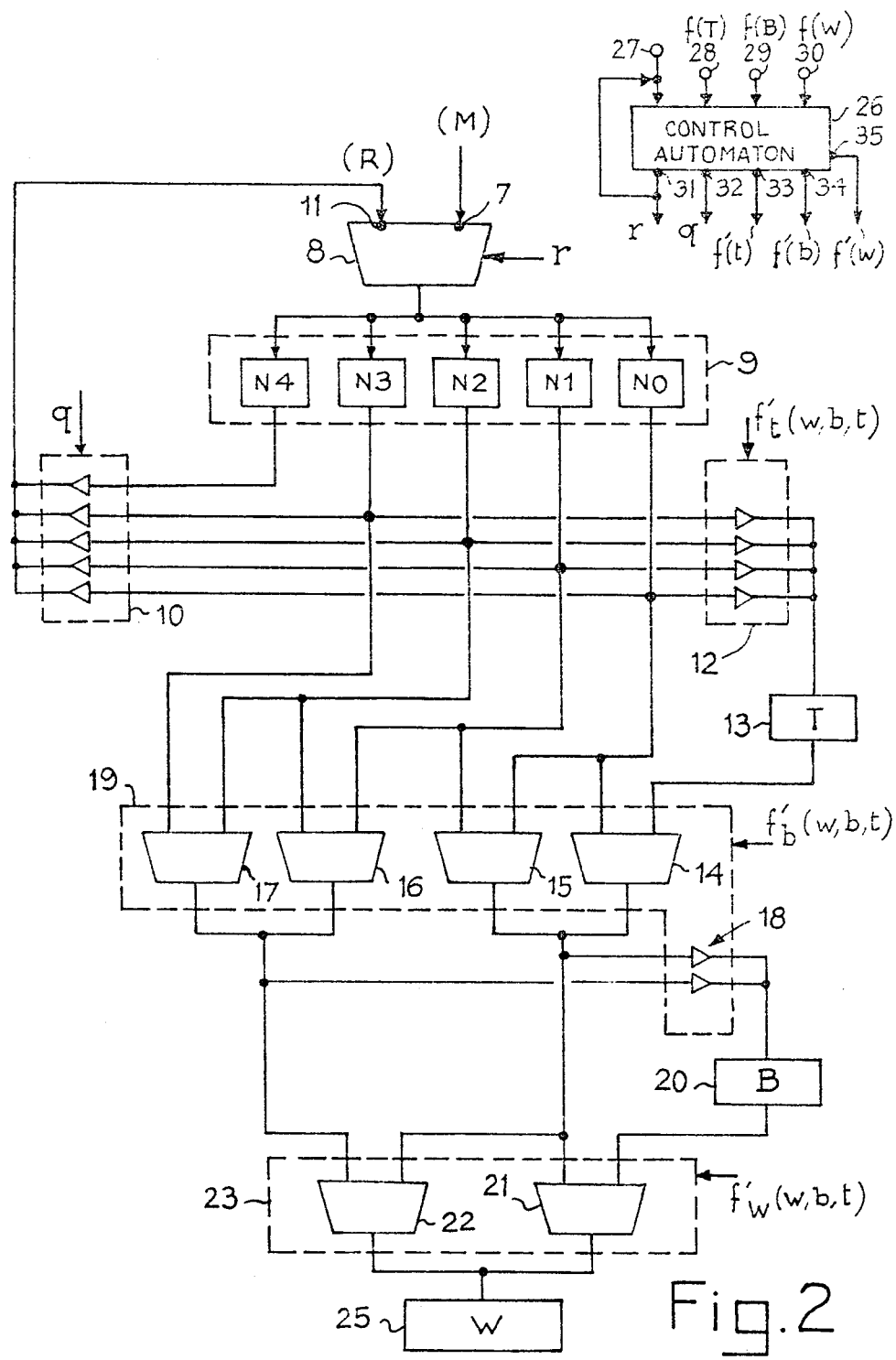
FIG. 2 is a block diagram of a mode of embodiment of a formatting device according to the invention.

FIG. 7 depicts a block diagram of a formatting device which works in the way described above. The output of the compressor (which is not depicted in FIG. 2) is linked to an input 7 of a justifier 8 which, according to a preferred mode of embodiment, is a multiplexer. The output of the device 8 is linked to the input of a register 9 with a capacity of twenty bits and is divided into five slices of four bits each, bearing references N0 to N4 respectively.

The outputs of the slices N0 to N4 are linked to an input 11 of the device 8 via a multiplexer 10 made simply by means of five three-state quadruple gates. The outputs of the slices N0 to N3 are furthermore, connected, through a multiplexer 12, to the input of a register 13 with four cells, the multiplexer 12 being made in the same way as the multiplexer 10. The output of the register 13 is linked to an input of an elementary multiplexer 14, the other input of which is linked to the output of the slice N0. The output of N0 is also linked to an input of an elementary multiplexer 15, the other input of which is linked to the output of N1, this latter output being also linked to an input of an elementary multiplexer 16. The output of N2 is linked on the one hand to the other input of the multiplexer 16 and, on the other hand, to an input of an elementary multiplexer 17, the other input of which is linked to the output of N3. The outputs of the multiplexers 14 to 17 are linked to an elementary multiplexer 18. The totality of elementary multiplexers 14 to 18 form the multiplexer 19. The various elementary multiplexers 14 to 17 can be made by conventional multiplexing integrated circuits and the multiplexer 18 can be made by means of three-state gates.

The output of the multiplexer 18 is linked to an eight-cell register 20. The output of the register 20 is linked to an input of an elementary multiplexer 21. The outputs of the registers 14 and 15 are linked on the one hand, to another input of the multiplexer 21 and on the other hand, to an input on a elementary multiplexer 22, another input of which is linked to the outputs of the multiplexers 16 and 17. The elementary multiplexers 21 and 22 form the multiplexer 23.

The outputs of the multiplexers 21 and 22 are linked to a sixteen-cell register 25. The registers 13, 20 and 25 respectively correspond to the registers T, B and W referred to above.

The formatting device also comprises a control automaton 26 which controls the justifier and the various multiplexers described above. The automaton 26 receives, at an input 27 linked to the compressor 1, the length of the successive codewords, and receives, at three other inputs 28 to 30 the flags f(T), f(B) and f(W) indicating the state of occupation of the registers 13, 20 and 25 respectively. The automaton 26 comprises five different outputs with reference numbers 31 to 35. The output 31 produces the data r of the length of the residue and controls the justifier 8 in the way explained below with reference to table 2. The output 32 produces the data q (equal to the whole part of 1/n as specified above) which controls the multiplexer 10 in the manner explained below. The outputs 33 to 35 produce signals f'(t), f'(b) and f'(w) to control the multiplexers 12, 19 and 23 in the manner explained above with reference to the table 1, the shuntings done by these multiplexers according to these control signals being obvious to the specialist, in the light of table 1.

As mentioned above, the input codewords from the compressor must be introduced just to the left of the residue if any, which is taken out of the incomplete slice if any of the register 9, the position of this slice being detected by means of the criterion q: in the multiplexer 10 the command q validates only the gate corresponding to the slice whose number is equal to q: for example, if q=2, i.e. if the residue is in N2 and if only the content of N0 and N1 is transferred to the registers located downstream of the register 9, the gate corresponding to N2 is validated. This residue is right justified in the input register of the justifier 8 and immediately to its left, the bits of the incident codeword M are introduced in the following manner:

if the bits of M are called a0, a1, a2 ... am, the bits of the residue R are called g0, g1, g2 and the bits of the content C of the input register of the justifier (i.e. of (M) (R)) are called b0, b1, b2 ... bl, the following (Table 2) is the truth table which gives the arrangement of the various bits of R, M and C as a function of r:

TABLE No. 2

| b1 ... b5 | b4 | b3 | b2 | b1 | b0 | r |
|-----------|----|----|----|----|----|---|
| ... | a4 | a3 | a2 | a1 | a0 | 0 |
| ... | a3 | a2 | a1 | a0 | g0 | 1 |
| ... | a2 | a1 | a0 | g1 | g0 | 2 |
| ... | a1 | a0 | g2 | g1 | g0 | 3 |

With the above explanations, the specialist can easily make the control automaton 26, using read-only memories, for example, programmed so as to obtain the signals r, q, f'(t), f'(b) and f'(w) on the basis of the input values r, m, f(t), f(b), f(w).

Figure 3:
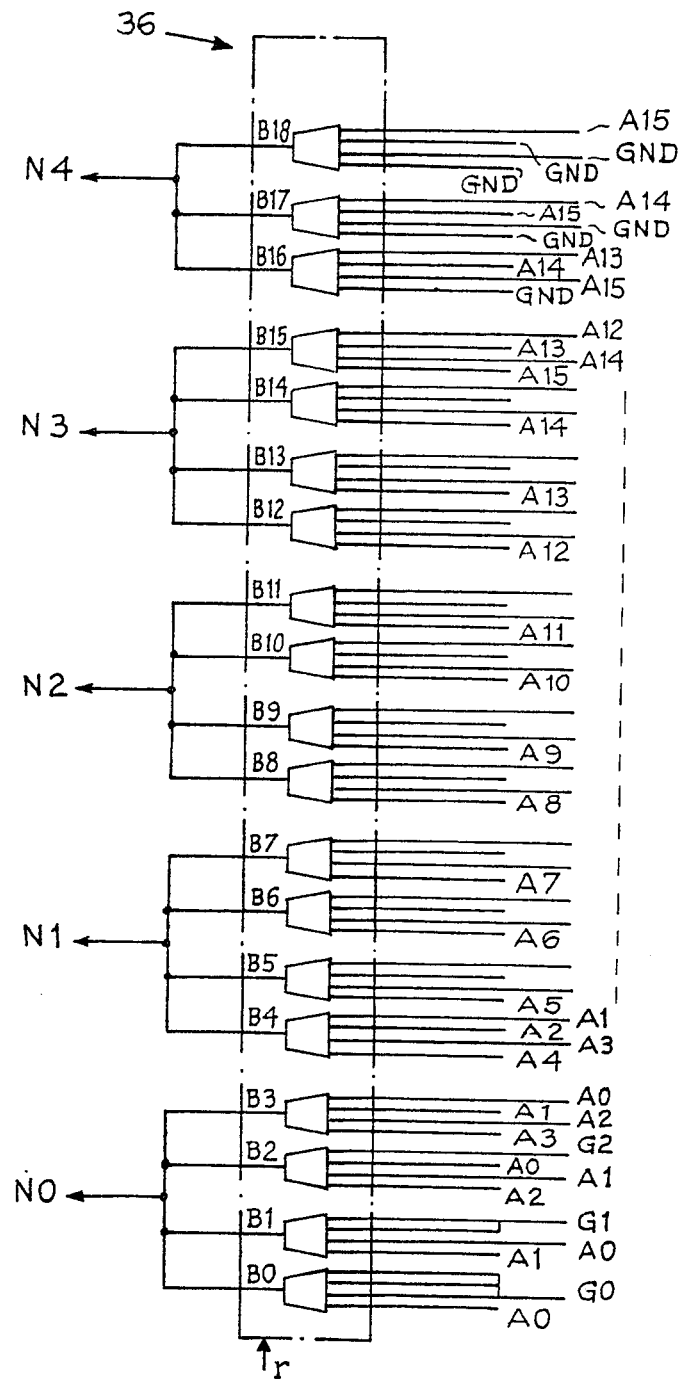
FIG. 3 is a block diagram of a circuit for justification by mixing, which can be used in the mode of embodiment depicted in FIG. 2.

FIG. 3 depicts the block diagram of a mode of embodiment of the justifier of the invention. The bits A0 to A15 of the codewords M are sent to the inputs of a row 36 of nineteen elementary multiplexers, each having four input wires and one output wire in the following combinations and in the following order: A0 - G0 (G0:

3 wires), A1 - A0 - G1 (G1: 2 wires), A2 - A1 - A0 - G2, A3 - A2 - A1 - A0, A4 - A3 - A2 - A1, A5 - A4 - A3 - A2, ..., ground (GND: 3 wires) - A15. B0, B1, ..., B18 are obtained respectively at the outputs of the elementary multiplexers. The bits B0 to B3 form N0 and so on up to N4 which comprises B16 to B18.

Figure 4:
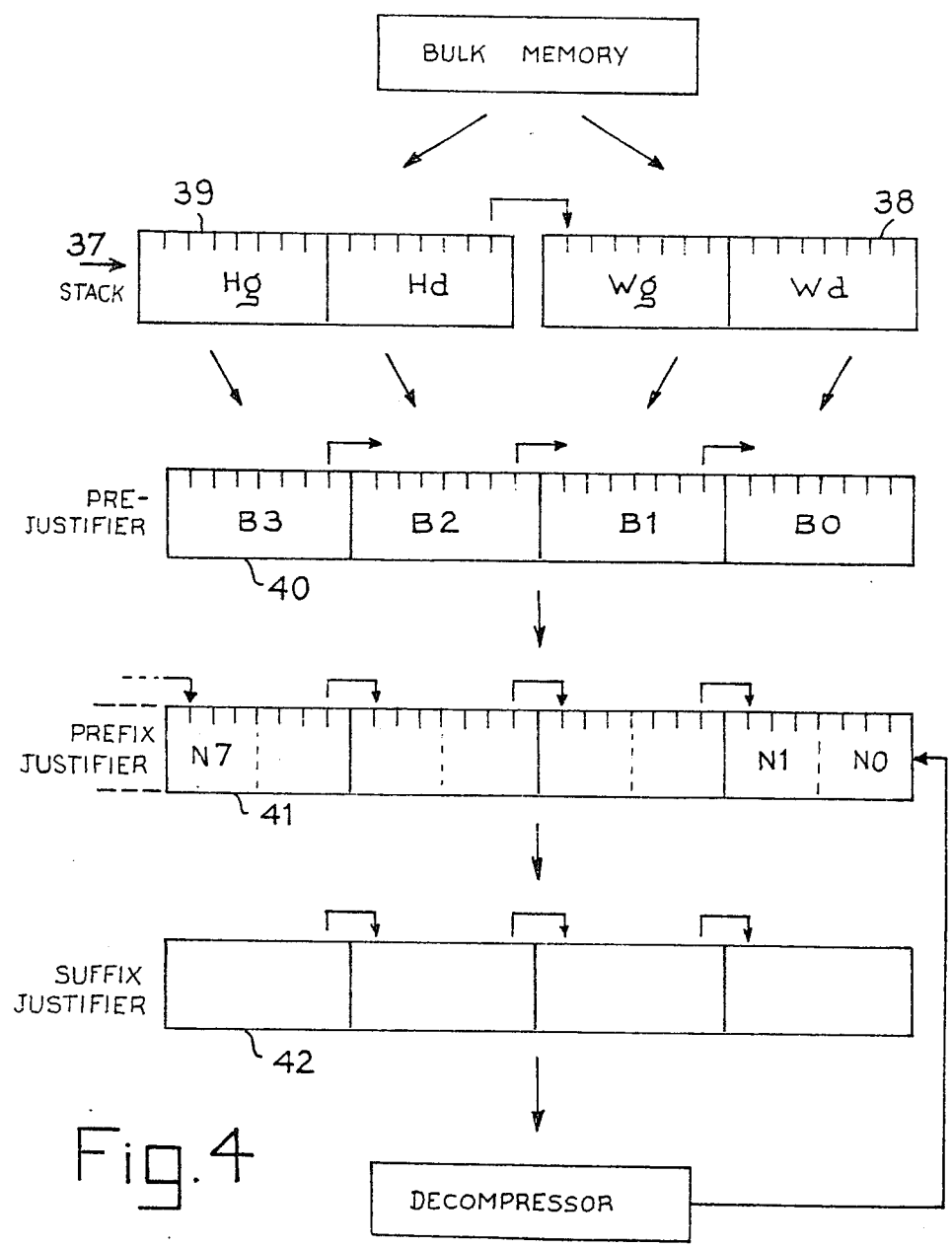
FIG. 4 is a diagram which explains the operation of an unformatting device according to the invention.
Figure 5:
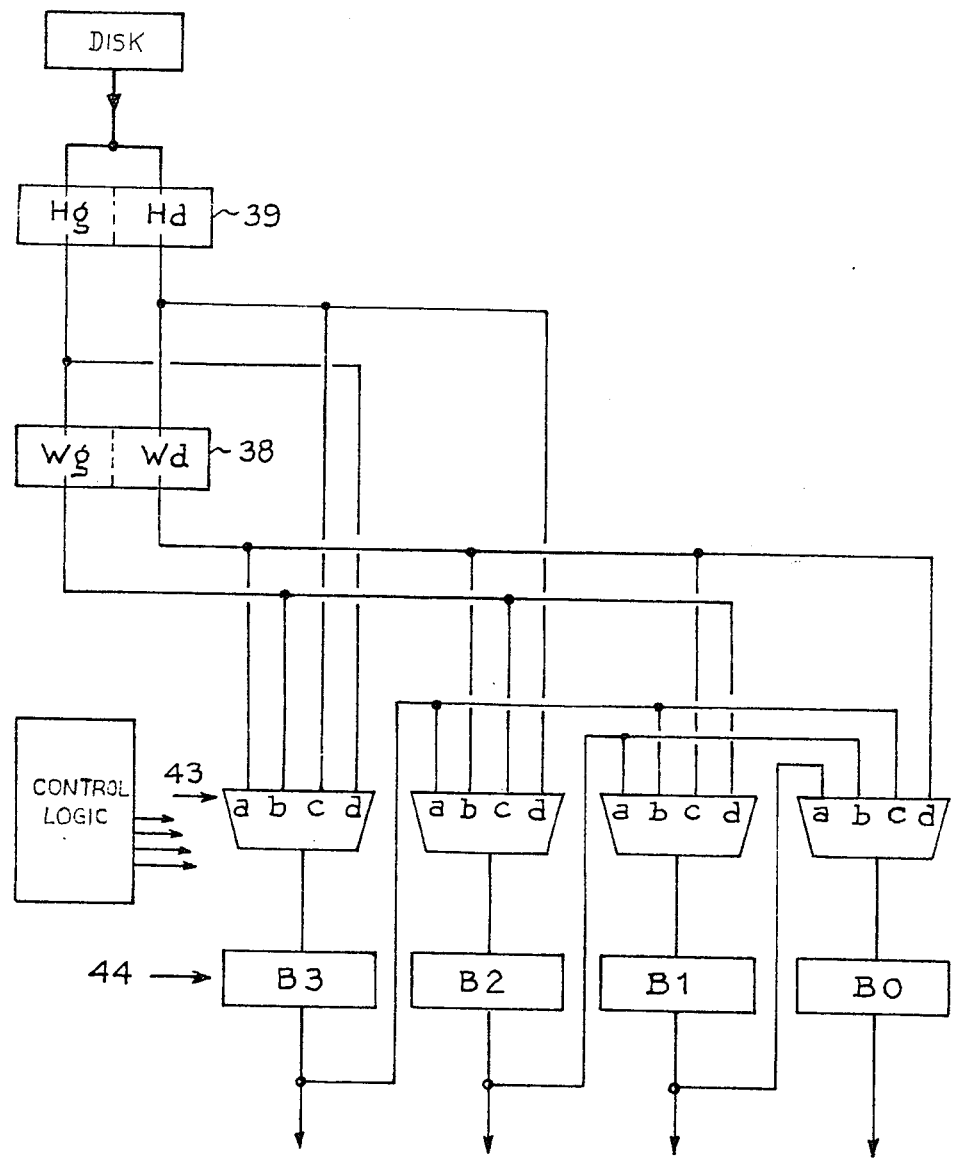
FIG. 5 is a block diagram of a mode of embodiment of a pre-justifier of an unformatting device according to the invention.

We shall now explain the operation of the unformatting device with reference to FIG. 4. The bulk memory sequentially sends the unformatting device words of constant length (16 bits in the present case). This unformatting device has the task of recognizing the boundaries of the codewords, extracting these words and presenting them justified (for example at the right-hand side on the drawing) to the decompression processor. At initialization, the first codeword is, of course, justified on its boundary (on the right) but the extraction of the following codewords makes their front boundary (the one relating to the previous word) slide leftwards by a quantity equal to the length of the words which have just been extracted. The main function of the unformatting device is to make a right-hand re-justification of any residue which might remain after the extraction of a recognized codeword, in order to present the decompressor with codewords, especially their prefixes, aligned on a boundary. This re-justification is done in two stages, as explained below, in order to minimize the number of transfers that have to be made.

The first stage is known as the "pre-justifying" stage. The words of constant length sent sequentially by the bulk memory are arrayed in a register 37 comprising a main register 38 and an ancillary register 39. If only the content of the register 38 is sent to the pre-justifier 40, the content of the register 39 is then transferred to it and the bulk memory loads the register 38. If the contents of both registers 38 and 39 are simultaneously sent to the pre-justifier, the bulk memory loads the register 38 and then the register 39. To simplify the explanation, the pre-justifier 40 is considered to be a register with the capacity of the register 37, i.e. a capacity of 32 bits in the preferred mode of embodiment described herein.

It is considered that in the pre-justifier 40, several words are distributed among a certain number of entities bearing references (B0) to (B3) from right to left, with a capacity of one octet each. It is supposed that, after the extraction of a codeword from the pre-justifier, the front boundary of the code to be processed is shifted by g bits leftwards in relation to the right end of the pre-justifier (as seen in the drawing). The function of the pre-justifier is to shift its content rightwards by a whole number s times b bits to bring the first bit (defining the front boundary) of the following codeword inside the entity B0. If the length of the codeword that has just been extracted from the pre-justifier is called m1 and the shift of its front boundary in relation to the right-hand end of the pre-justifier is called d1, we get: g=m1+d1 (of course, at initialization m1 and d1 are nil). The front boundary of the codeword to be extracted should therefore be shifted rightwards by: s=whole number (g/b). After this shift, the front boundary of the word to be extracted will be at a distance of d2=g modulo b from the right-hand end of the pre-justifier, and of course the value of d2 is equal to or greater than zero but is smaller than b.

Thus, knowing the value of s, transfers are made in the pre-justifier from one entity (B) to another one located more to the right with an amplitude leap determined by s: if s=1, then the shifts take place step by step from the left to the right, if s=2, the content of B2 is transferred to B0 and so on.

The justification as such is then done. This justification process can be split up into the justification of the prefix followed by the justification of the suffix. To simplify the explanation, the prefix justifier 41 is compared to a register with the same capacity as the pre-justifier, which therefore, like this latter unit, comprises four entities (B). If these entities are themselves considered to be modules of a size n=b/2, the justification consists in bringing, to a right-hand boundary of the module, the boundary of the codeword which is currently shifted leftwards by d2. The amplitude d3 of the shift to be made is: d3=d2 modulo n, d3 being equal to or greater than zero but less than n. The prefix of the codeword to be extracted will be justified on the right-hand boundary of one of the two modules (No) or (N1) of (B0) of the justifier 41 according to the value of r=whole number (d2/n): if r=0, it will be (No), and if r=1, it will be (N1).

Knowing the value of r, and knowing the length of the codeword (given by the decompressor), it is easy to extract this codeword. The use of the prefix of the codeword can give the data needed for the justification, if any, of the suffix, done by a suffix justifier 42 which is identical to the prefix justifier and which works in the same way as the latter.

The functioning of the unformatting device is controlled by a control automation similar to that of the formatting device. The register 37 is called a "stack" below, the register 38 being divided into two entities with references (Wg) and (Wd) from left to right, and the register 39 being divided into two entities with references (Hg) and (Hd) from left to right.

Depending on the number of leaps s to which the octets coming from the register 37 undergo during the pre-justification, an empty space appears to the left of the pre-justifier. This empty space must be filled by one or more octets taken from the register 37 which therefore also undergoes an "erosion" which makes it necessary to re-load it from the bulk memory. The table 3 below gives the changes in states undergone by the control automaton during these various transfers. The variables of states used for this automaton are s and OP. OP is a parity indicator for the number of leaps already made at the pre-justifying stage. At the stack, there are three different operations: no loading of the battery, a single loading (from 39 to 38 and from the disk to 39) and a double loading (from the disk 39 *and* 38). In the table 3, the line of s=4 corresponds to the initialization of the automaton. As in the case of the formatting device, the automaton of the unformatting device can be made using read-only memories for example, the programming of which will be evident to the specialist in the light of the following explanations and in the light of the table No. 3.

TABLE No. 3

| s | OP | transfers | "STACK" Operations |
|---|----|-----------|--------------------|
| 0 | x | none | none |
| 1 | Even | (B0) = (B2)<br>(B1) = (B2)<br>(B2) = (B3)<br>(B3) = (Wd)<br>OP = odd | none |
|   | odd | (B0) = (B1)<br>(B1) = B2)<br>(B2) = (B3)<br>(B3) = (Wg)<br>OP = even | single |

TABLE No. 3-continued

| s | OP | transfers | "STACK" Operations |
|---|---|---|---|
| 2 | even | (B0) = (B2)<br>(B1) = (B3)<br>(B2) = (Wd)<br>(B3) = (Wg)<br>OP = even | single |
|   | odd | (B0) = (B2)<br>(B1) = (B3)<br>(B2) = (Wg)<br>(B3) = (Hd)<br>OP = odd | single |
| 3 | even | (B0) = (B3)<br>(B1) = (Wd)<br>(B2) = (Wg)<br>(B3) = (Hd)<br>OP = odd | single |
|   | odd | (B0) = (B3)<br>(B1) = (Wg)<br>(B2) = (Hd)<br>(B3) = (Hg)<br>OP = even | double |
| 4 | x | (B0) = (Wd)<br>(B1) = (Wg)<br>(B2) = (Hd)<br>(B3) = (Hg)<br>OP = even | single |

FIG. 3 depicts a block diagram of a pre-justifier according to the invention. The registers 39 and 38 are cascade-linked to the output of the disk drive. The output of the element Wd of the register 38 is linked to one input each of the four elementary multiplexers—with four one-octet inputs each and one output on one octet—of a multiplexing stage 43 (the said inputs to which the output of the element Wd are connected bearing the references a, b, c, d respectively in that order) the outputs of the four elementary multiplexers being each linked to an elementary register of a stage 44 of registers, respectively given the references B3 to B0 from left to right. The output of the element Wg of the register 38 is linked to another input (b, c, d respectively) of each of the three multiplexers at the left of the stage 43. The output of the element Hd is linked to an input (respectively c, d) of the two multiplexers at the left of the stage 43, and the output of Hg is linked to the fourth input (d) of the first multiplexer at the left of the stage 43. The output of B3 is linked to an input (respectively a, b, c) of each of the three right-hand registers of the stage 43, the output of B2 is linked to an input (respectively a, b) of each of the two last right-hand registers, and the output of B1 is linked to an output (a) of the last right-hand register of the stage 43. The outputs B3 to B0 are the outputs of the pre-justifier.

Figure 6:
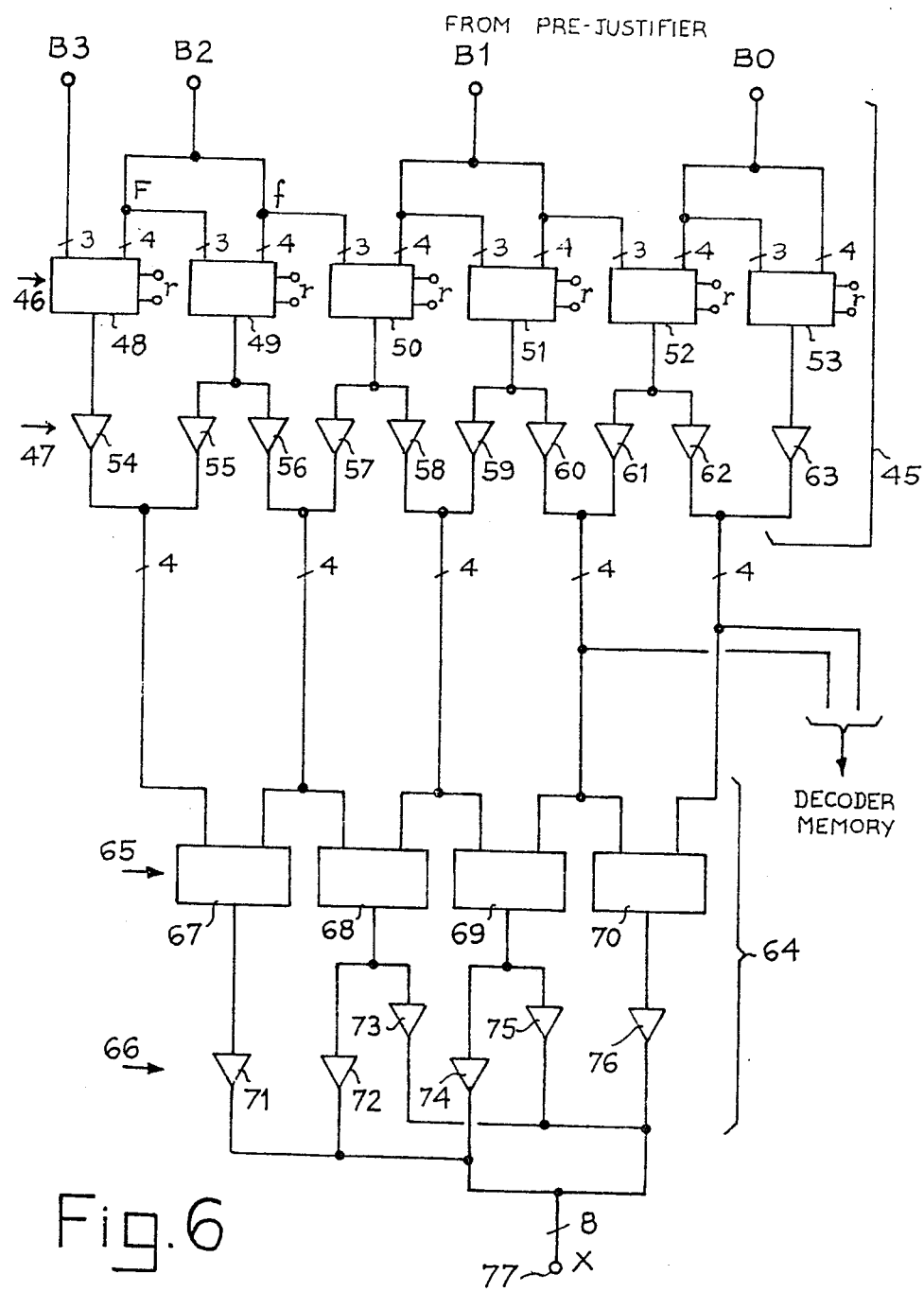
FIG. 6 is a block diagram of a mode of embodiment of the justifier of an formatting device according to the invention.

The prefix justifier 45 (FIG. 6) comprises a stage 46 of shifter logic circuits followed by a stage 47 of three-state quadruple doors forming a multiplexer. The stage 46 comprises six elementary circuits bearing references 48 to 53 from right to left on the drawing and capable of making a shift of 0, 1, 2 or 3 bits on an input word of seven bits, depending on the value of r (defined on 2 bits). The output of B3 (on 3 bits) and the 4 least significant bits of output of B2 are linked to the circuit 48. All the outputs of B2, except the least significant one are linked to the circuit 49. The three most significant outputs of B2 and the four least significant outputs of B1 are linked to the circuit 50. The outputs, except the least significant one, of B1 are linked to the circuit 51. The three most significant outputs of B1 and the four least significant outputs of B0 are linked to the circuit 52, and finally all the outputs of B0, except the least significant one, are linked to the circuit 53.

The stage 47 comprises ten three-state quadruple gates, bearing references 54 to 63 respectively from right to left on the drawing. The gate 54 is linked to the output of 48, the gates 55, 56 are linked to the output of 49, the gates 57, 58 are linked to the output of 50, the gates 59, 60 to the output of 51, the gates 61, 62 to the output of 52, and the gate 63 to the output of 53.

The outputs of the gates 60 and 61 on the one hand and the gates 62, 63 on the other hand are linked to a decompressor decoder memory, for example the memory with the reference 26 in the French patent application No. 8517949, registered on behalf of the applicant, this memory supplying the decoded value of the standard pixel and the length of the acknowledged code.

The suffix justifier 64, connected downstream of the prefix justifier 45, comprises a stage 65 of shifter logic circuits followed by a stage 66 of three-state quadruple gates forming a multiplexer. The stage 65 comprises four logic circuits 67 to 70. The outputs of each of the gate couples 54 and 55, 56 and 57, 58 and 59, 60 and 61, 62 and 63 are linked each time to a bus with four conductors. The circuit 67 is linked to the output bus of the gates 54 to 57, the circuit 68 to the output bus of the gates 56 to 59, the circuit 69 to the output bus of the gates 58 to 61 and the circuit 70 to the output bus of the gates 60 to 63.

The stage 66 comprises six three-state quadruple gates bearing reference numbers 71 to 76 respectively, the outputs of which are linked by an eight-conductor bus to the output 77 of the justifier.

The outputs of the gates 71, 72 and 74 are linked to the four least significant conductors of this bus and the outputs of the gates 73, 75 and 76 are linked to the most significant conductors of this bus.

What is claimed is:

1. A method for formatting and unformatting data resulting from variable length encoding wherein said encoding comprises the steps of:
   encoding words of variable length;
   concatenating said words into a string;
   cutting said string into entities of a fixed length; and
   wherein said formatting comprises:
   temporarily and consecutively storing said encoded words in an input register;
   justifying said stored words within said register such that any residue is stored towards one of the ends of said register;
   dividing, from the end of said register, where any residue is stored, adjacent slices of the same length wherein the slice comprises that portion of data at the other end of said register which maybe incomplete and which may comprise a new residue, each of said slices comprising four bits;
   transferring from the register at the starting level to a register having the same capacity as the length of said entities, at the output level;
   wherein the encoded words, in their transfer from the register at the starting level to the register at the output level, pass, if necessary, through all the complete slices of the starting level by means of intermediate-level registers; and
   shifting if necessary, any remaining incomplete slice to the said end of the starting-level register, wherein intermediate registers each has a capacity equal to a whole multiple of the length of a slice, this capacity increasing from the starting level to the output level;

transferring the complete slices, which are transferred after those of the intermediate levels, in order and by priority, towards the output level until said output level is completely filled;

transferring in turn, those slices which cannot be transferred to this output level because it is full, to the intermediate-level registers so that they fill either, by priority, those registers which already contain slices which could not earlier be transferred to the output level, then to those registers whose capacity is closest to the capacity needed to take the remaining slices, using the minimum number of levels or, if all the intermediate-level registers are empty, so that they fill one or more of these intermediate-level registers, using them to the minimum extent, the contents of these intermediate-level registers being then transferred, by priority, to the output level in keeping with the order of precedence, in time, the content of the output level being transferred towards the bulk memory device as soon as it is full;

and wherein said unformatting comprises:

the temporary and consecutive storage of the successive slices of the concatenated codes from the bulk memory in a higher-level register with a capacity equal to the longest code used;

pre-justification of the data at one end of this register of the code closest to this end of the register so that the end of the code which is closest to this end of the register reaches the end of one of the end zones of determinate length in the register by a shift equal to a whole number multiplied by the length of the zone, transferring at least in part the code thus pre-justified to one or more intermediate registers justifying this code at one end of these registers, and consisting in the transfer of the code thus justified to an output register.

2. Method according to claim 1, wherein first the prefix of the code is justified, and then its suffix.

3. Device for the formatting and unformatting of data resulting from the encoding of digital data using a variable-length code, wherein its formatting device comprises a justifier linked to the input of an input register, the output of which is linked, firstly, to an input of the justifier via an initial multiplexer, secondly, to a first intermediate register via a second multiplexer, and thirdly to a third multiplexer, the output of the first intermediate register being also linked to this third multiplexer, the output of the third multiplexer being linked to a second intermediate register and to a fourth multiplexer to which is also linked the output of the second intermediate register, the output of the fourth multiplexer being linked to an output register.

4. Device for the formatting and unformatting of data according to claim 3, wherein its unformatting device comprises a pre-justifier followed by a justifier, the pre-justifier comprising at least one input register followed by a multiplexer and a pre-justifying register, the justifier comprising at least one state of shifter logic circuits and one multiplexer.

5. Device for the formatting and unformatting of data according to the claim 4, wherein the justifier comprises a prefix justifier followed by a suffix justifier, each comprising a stage of shifter logic circuits and an multiplexer.

* * * * *